United States Patent
Lee et al.

(10) Patent No.: US 10,957,727 B2
(45) Date of Patent: Mar. 23, 2021

(54) PHASE DETECTION PIXELS WITH DIFFRACTIVE LENSES

(71) Applicant: SEMICONDUCTOR COMPONENTS INDUSTRIES, LLC, Phoenix, AZ (US)

(72) Inventors: Byounghee Lee, Meridian, ID (US); Ulrich Boettiger, Garden City, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 276 days.

(21) Appl. No.: 16/142,231

(22) Filed: Sep. 26, 2018

(65) Prior Publication Data

US 2020/0098812 A1  Mar. 26, 2020

(51) Int. Cl.
*H01L 27/146* (2006.01)
*G02F 1/1335* (2006.01)

(52) U.S. Cl.
CPC .. *H01L 27/14621* (2013.01); *G02F 1/133514* (2013.01); *H01L 27/14627* (2013.01); *H01L 27/14643* (2013.01)

(58) Field of Classification Search
CPC ............. H01L 27/146; H01L 27/14621; H01L 27/14625; H01L 27/14627
USPC ...................................................... 250/208.1
See application file for complete search history.

(56) References Cited

U.S. PATENT DOCUMENTS

| | | |
|---|---|---|
| 4,878,735 A | 11/1989 | Vilums |
| 5,734,155 A | 3/1998 | Rostoker |
| 9,099,580 B2 | 8/2015 | Hirigoyen et al. |
| 2005/0110104 A1 | 5/2005 | Boettiger et al. |
| 2005/0242271 A1 | 11/2005 | Weng et al. |
| 2006/0145056 A1 | 7/2006 | Jung |
| 2006/0177959 A1 | 8/2006 | Boettiger |
| 2006/0292735 A1 | 12/2006 | Boettiger et al. |
| 2007/0001252 A1 | 1/2007 | Noda et al. |
| 2007/0127125 A1 | 6/2007 | Sasaki |
| 2007/0278604 A1 | 12/2007 | Minixhofer |
| 2009/0090937 A1 | 4/2009 | Park |
| 2009/0127440 A1 | 5/2009 | Nakai |
| 2009/0160965 A1 | 6/2009 | Sorek et al. |
| 2010/0091168 A1 | 4/2010 | Igarashi |
| 2011/0096210 A1 | 4/2011 | Koshino et al. |

(Continued)

OTHER PUBLICATIONS

Lee, U.S. Appl. No. 15/719,174, filed Sep. 28, 2017.

(Continued)

*Primary Examiner* — Kevin K Pyo

(74) *Attorney, Agent, or Firm* — Treyz Law Group, P.C.; Joseph F. Guihan

(57) ABSTRACT

An image sensor may include phase detection pixels that gather phase detection data. The phase detection pixels may be formed in phase detection pixel groups with two or more phase detection pixels covered by a single microlens. Each phase detection pixel may have an asymmetric angular response to incident light. Phase detection pixels may be covered by diffractive lenses. A diffractive lens may cover a phase detection pixel pair to improve angular separation between the pixels. A diffractive lens may partially cover a phase detection pixel in a phase detection pixel pair to shift the angular response and account for an off-axis chief ray angle of the phase detection pixel pair.

9 Claims, 11 Drawing Sheets

(56) References Cited

U.S. PATENT DOCUMENTS

| | | |
|---|---|---|
| 2011/0234830 A1 | 9/2011 | Kiyota et al. |
| 2013/0015545 A1 | 1/2013 | Toumiya et al. |
| 2013/0038691 A1 | 2/2013 | Agranov et al. |
| 2013/0240962 A1 | 9/2013 | Wang et al. |
| 2014/0091205 A1 | 4/2014 | Takamiya |
| 2014/0197301 A1 | 7/2014 | Velichko et al. |
| 2014/0313379 A1 | 10/2014 | Mackey |
| 2015/0109501 A1 | 4/2015 | Sekine |
| 2016/0111461 A1 | 4/2016 | Ahn et al. |
| 2016/0211306 A1 | 7/2016 | Choi et al. |
| 2016/0269662 A1* | 9/2016 | Hepper ............ H01L 27/14645 |
| 2016/0351610 A1 | 12/2016 | Chen |
| 2016/0377871 A1 | 12/2016 | Kress et al. |
| 2017/0077163 A1 | 3/2017 | Chou et al. |
| 2017/0133420 A1 | 5/2017 | Silsby |
| 2017/0141145 A1 | 5/2017 | Yamashita et al. |
| 2017/0176787 A1 | 6/2017 | Jia et al. |
| 2018/0026065 A1 | 1/2018 | Hsieh et al. |
| 2018/0145103 A1 | 5/2018 | Hirigoyen |

OTHER PUBLICATIONS

Lee, U.S. Appl. No. 15/719,181, filed Sep. 28, 2017.
Lenchenkov et al., U.S. Appl. No. 15/701,116, filed Sep. 11, 2017.

* cited by examiner

PHASE DETECTION PIXELS WITH DIFFRACTIVE LENSES

BACKGROUND

This relates generally to imaging systems and, more particularly, to imaging systems with phase detection capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

Yet another arrangement for electronic devices to identify distances includes using phase detection pixels. However, performance of conventional phase detection pixels may be unsatisfactory.

It would therefore be desirable to be able to provide improved phase detection pixel arrangements for image sensors.

DETAILED DESCRIPTION

Figure 1:
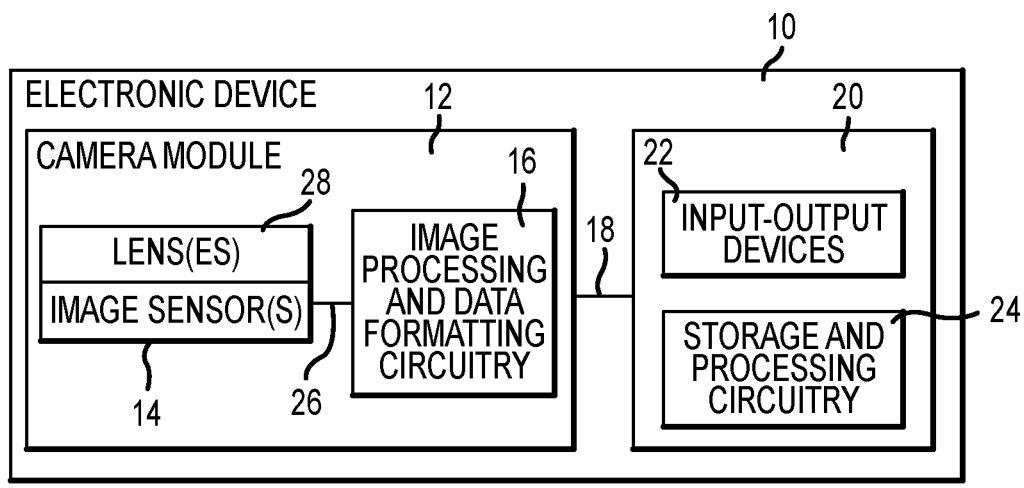
FIG. 1 is a schematic diagram of an illustrative electronic device with an image sensor that may include phase detection pixels with diffractive lenses in accordance with an embodiment of the present invention.

Embodiments of the present invention relate to image sensors with automatic focusing and depth sensing capabilities. An electronic device with a camera module is shown in FIG. 1. Electronic device 10 may be a digital camera, a computer, a cellular telephone, a medical device, or other electronic device. Camera module 12 (sometimes referred to as an imaging device) may include one or more image sensors 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. For example, camera sensor 14 and image processing and data formatting circuitry 16 may be formed using separate integrated circuits that have been stacked.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide image sensors with depth sensing capabilities (e.g., to use in automatic focusing applications, 3D imaging applications such as machine vision applications, etc.). To provide depth sensing capabilities, image sensor 14 may include phase detection pixel groups such as pixel pair 100 shown in FIG. 2A.

Figure 2A:
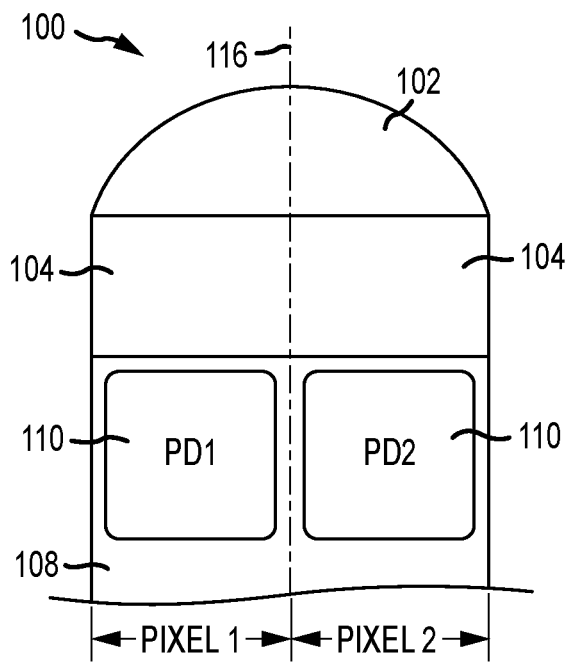
FIG. 2A is a cross-sectional view of illustrative phase detection pixels having photosensitive regions with different and asymmetric angular responses in accordance with an embodiment of the present invention.

FIG. 2A is an illustrative cross-sectional view of pixel pair 100. Pixel pair 100 may include first and second pixels such as Pixel 1 and Pixel 2. Pixel 1 and Pixel 2 may include photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. Any other types of phase detection pixel group (e.g., 2×2, 3×3, 1×3, etc.) may be included in image sensor 14. Microlens 102 may have a width and a length, with the length being longer than the width. Microlens 102 may have a length that is about twice as long as its width. Microlens 102 may be in the shape of an ellipse with an aspect ratio of about 2:1. In other embodiments, microlens 102 may be another shape such as a rectangle or another desired shape (e.g., circular, toroidal). Microlens 102 may have an aspect ratio of less than 2:1, 2:1, greater than 2:1, between 1.5:1 and 2.5:1, greater than 3:1, or any other desired aspect ratio.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the certain ranges of wavelengths). Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or back side illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

Figure 2B:
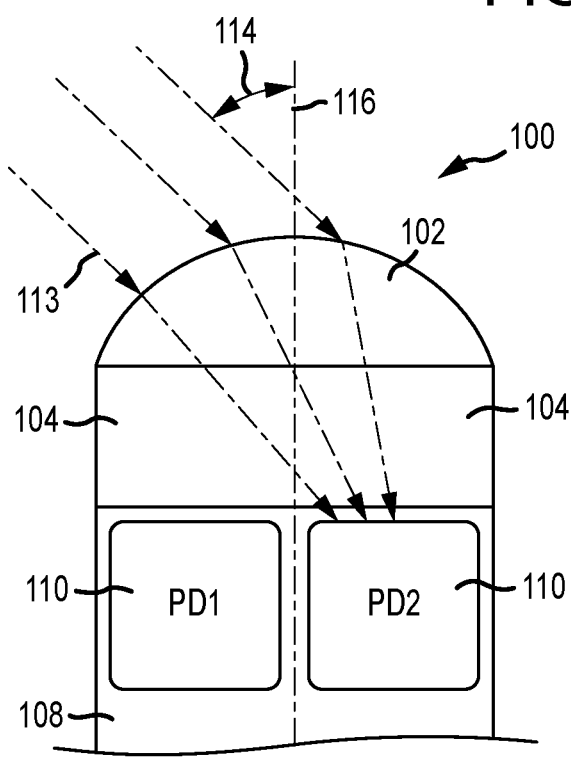
FIGS. 2B and 2C are cross-sectional views of the phase detection pixels of FIG. 2A in accordance with an embodiment of the present invention.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
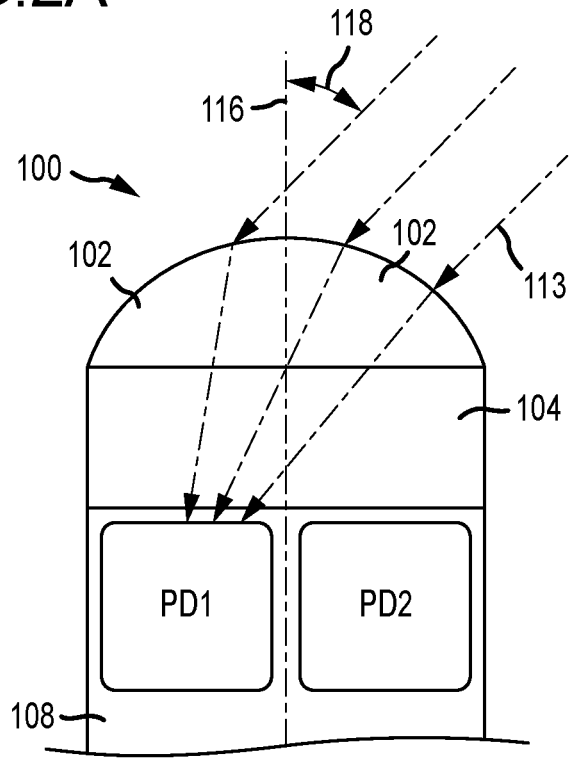

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

Figure 3:
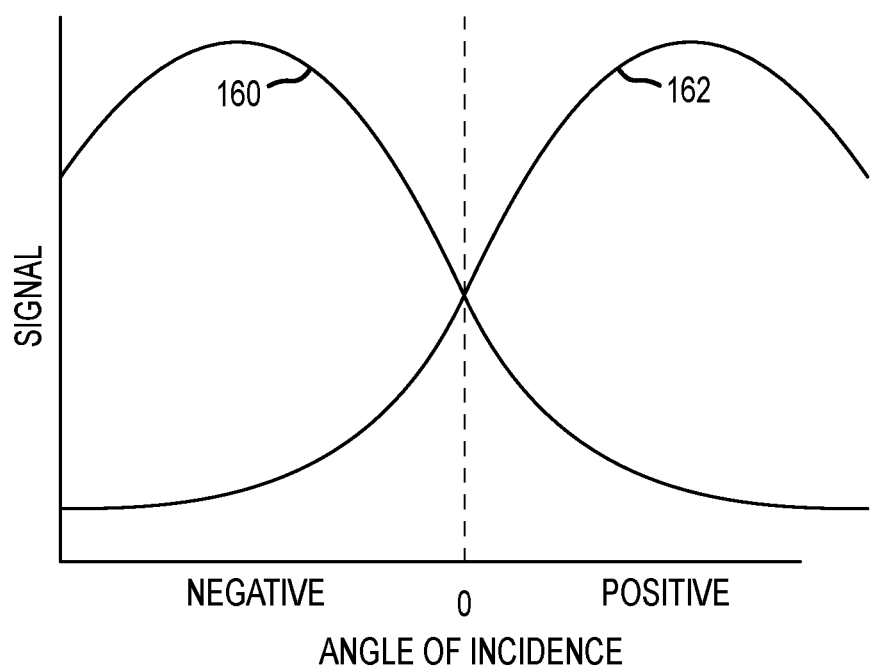
FIG. 3 is a diagram of illustrative signal outputs of phase detection pixels for incident light striking the phase detection pixels at varying angles of incidence in accordance with an embodiment of the present invention.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the pixel signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in camera module 12 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel groups that are used to determine phase difference information such as pixel pair 100 are sometimes referred to herein as phase detection pixels or depth-sensing pixels.

Alternatively, the phase difference information may be used to determine a distance between the camera module and an object in the scene. In other words, the depth-sensing pixels may be used to create a depth map of the scene.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another) or to determine the distance of an object in the scene from the camera module.

Figure 4A:
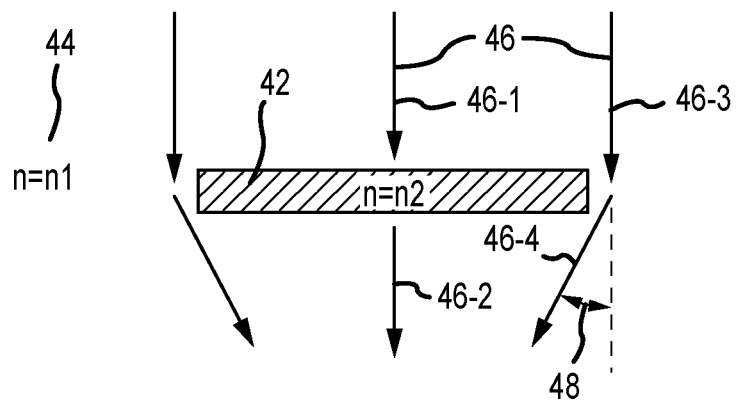
FIG. 4A is a cross-sectional side view of an illustrative focusing diffractive lens with a greater index of refraction than the surrounding medium in accordance with an embodiment.
Figure 4B:
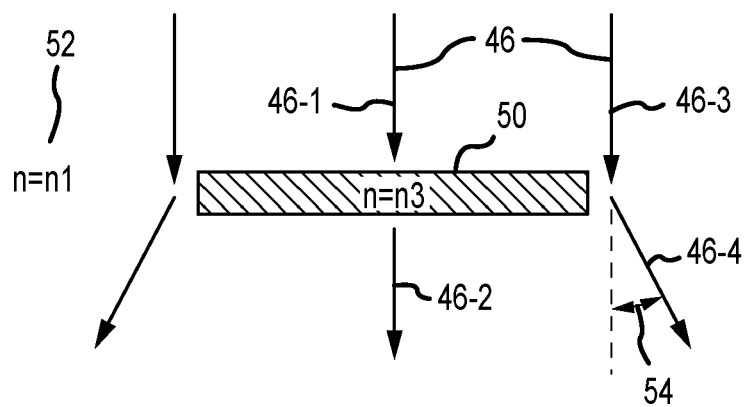
FIG. 4B is a cross-sectional side view of an illustrative defocusing diffractive lens with a lower index of refraction than the surrounding medium in accordance with an embodiment.

To help control the light received by phase detection pixels, the phase detection pixel pair may include a diffractive lens in addition to or instead of microlens 102 of FIG. 2A. FIGS. 4A and 4B are cross-sectional side views of illustrative diffractive lenses that may be used in image sensors with phase detection pixels. As shown in FIG. 4A, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 4A, the index of refraction of the lens may be greater than the index of refraction of the surrounding material (i.e., n2>n1). This results in incident light being focused towards a focal point. In this arrangement, diffractive lens 42 acts as a convex lens.

Lens 42 may be transparent to incident light. Therefore, some light may pass through the lens without being focused. For example, incident light 46-1 may pass through the center of diffractive lens 42. The corresponding light 46-2 on the other side of the diffractive lens may travel in the same direction as incident light 46-1. In contrast, incident light at the edge of diffractive lens 42 may be redirected due to diffraction. For example, incident light 46-3 may pass by the edge of diffractive lens 42. The light may be redirected such that the output light 46-4 travels at an angle 48 relative to the incident light 46-3. In other words, the diffractive lens redirects the light at the edge of the lens using diffraction.

Diffraction occurs when a wave (such as light) encounters an obstacle. When light passes around the edge of an object, it will be bent or redirected such that the direction of the original incident light changes. The amount and direction of bending depends on numerous factors. In an imaging sensor, diffraction of light can be used (with diffractive lenses) to redirect incident light in desired ways (e.g., focusing incident light on photodiodes to mitigate optical cross-talk or increase angular separation, account for an offset due to the chief ray angle, etc.).

In the example of FIG. 4A, diffractive lens 42 has an index of refraction greater than the index of refraction of the surrounding medium 44. This causes incident light to be focused towards a focal point. However, this example is merely illustrative and other embodiments may be used.

As shown in FIG. 4B, a diffractive lens 50 may be formed in a surrounding medium 52. The surrounding material 52 may be formed from a first material that has a first index of refraction (n1). Diffractive lens 50 may be formed from a third material that has a third index of refraction (n3). In the example of FIG. 4B, the index of refraction of the lens may be less than the index of refraction of the surrounding material (i.e., n1>n3). This results in incident light 46 being defocused. In this arrangement, diffractive lens 50 acts as a concave lens.

Lens 50 may be transparent to incident light. Therefore, some light may pass through the lens without being focused. For example, incident light 46-1 may pass through the center of diffractive lens 50. The corresponding light 46-2 on the other side of the diffractive lens may travel in the same direction as incident light 46-1. In contrast, incident light at the edge of diffractive lens 50 may be redirected due to diffraction. For example, incident light 46-3 may pass by the edge of diffractive lens 50. The light may be redirected such that the output light 46-4 travels at an angle 54 relative to the incident light 46-3. In other words, the diffractive lens redirects the light at the edge of the lens using diffraction.

Figure 5A:
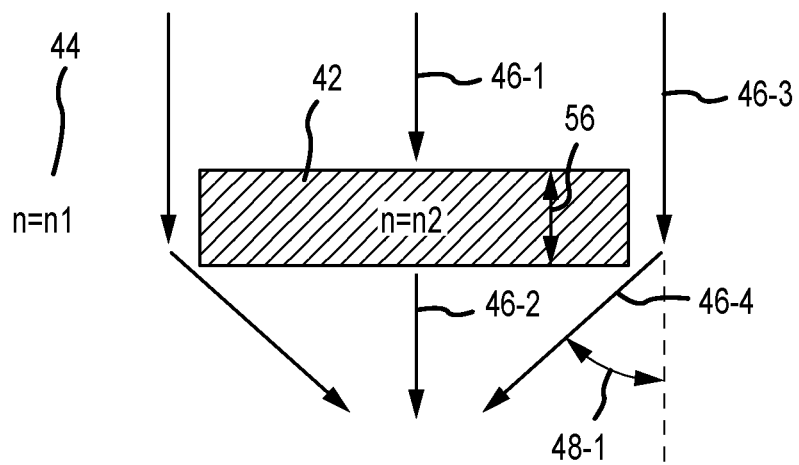
FIGS. 5A and 5B are cross-sectional side views of illustrative diffractive lenses showing how the thickness of the diffractive lens may be adjusted to change the response to incident light in accordance with an embodiment.
Figure 5B:
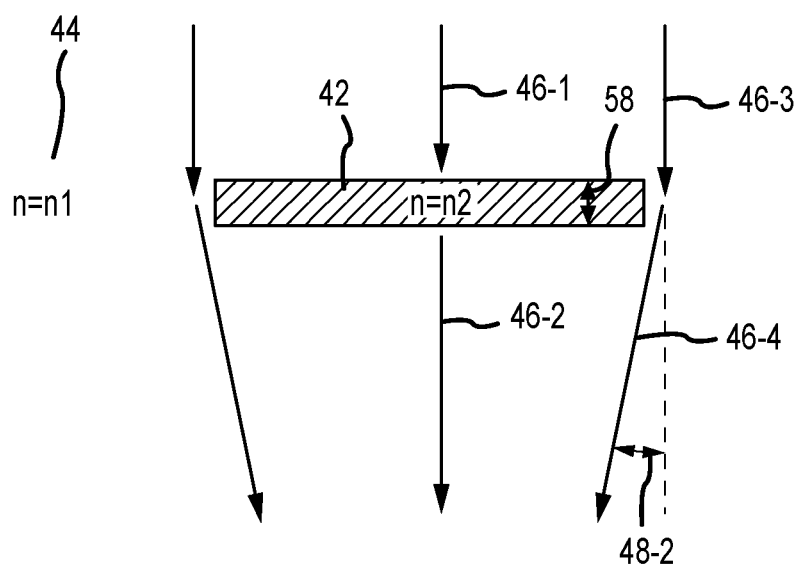

In addition to the refractive indices of the diffractive lens and the surrounding material, the thickness of the diffractive lens may also affect the response of incident light to the diffractive lens. FIGS. 5A and 5B show illustrative diffractive lenses used to focus incident light (such as the lens shown in FIG. 4A). As shown in FIG. 5A, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 5A, the index of refraction of the lens may be greater than the index of refraction of the surrounding material (i.e., n2>n1). This results in the light being focused to a focal point.

In particular, incident light 46-3 may pass by the edge of diffractive lens 42. The light may be redirected such that the output light 46-4 travels at an angle 48-1 relative to the incident light 46-3. This angle may be dependent upon the thickness 56 of diffractive lens 42. In the example of FIG. 5A, thickness 56 is associated with an angle of diffraction of 48-1. Diffractive lens 42 in FIG. 5A may have a relatively large thickness and, accordingly, a relatively large angle of diffraction 48-1.

In contrast, diffractive lens 42 in FIG. 5B may have a relatively small thickness and a relatively small angle of diffraction 48-2. As shown in FIG. 5B, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 5B, the index of refraction of the lens may be greater than the index of refraction of the surrounding material (i.e., n2>n1). This results in the light being focused to a focal point. In particular, the light at the edge of the diffractive lens may be redirected such that the output light 46-4 travels at an angle 48-2 relative to the incident light 46-3. This angle may be dependent upon the thickness 58 of diffractive lens 42. Because thickness 58 in FIG. 5B is less than thickness 56 in FIG. 5A, angle 48-2 in FIG. 5B is less than angle 48-1 in FIG. 5A.

Diffractive lenses 42 in FIGS. 5A and 5B have the same length and width. However, the length and width of diffractive lenses may also be adjusted to alter the response of incident light 46. The diffractive lenses may only redirect incident light that passes within a given distance of the edge of the diffractive lens (e.g., the interface between the two materials having different indices of refraction). The given distance may be approximately one half of the wavelength of the incident light.

This shows how diffractive lenses may be used to redirect incident light in desired ways. The refractive indices of the lens and surrounding material may be altered to customize the response of incident light. Additionally, the thickness, length, and width, of the diffractive lens may be altered to customize the response of incident light.

In FIGS. 4A, 4B, 5A, and 5B, diffractive lenses (e.g., diffractive lens 42 and diffractive lens 50) are depicted as being formed from a single layer of material having a first index of refraction that is surrounded by a surrounding medium having a second index of refraction that is different than the first index of refraction. Because these diffractive lenses have one uniform index of refraction (and therefore one refractive index difference between the lens and surrounding medium), these types of diffractive lenses may be referred to as single-edge diffractive lenses. These types of diffractive lenses may also be referred to as single-refractive-index diffractive lenses.

The aforementioned single-edge diffractive lenses may be effective at focusing or defocusing light at the edges of the diffractive lenses. Light at the center of the diffractive lenses may pass through without being focused or defocused as desired. However, light between the center and edges of the diffractive lenses passes through the diffractive lens without being focused or defocused. This may not be desirable, as performance of the lens may be improved if light between the center and edges of the diffractive lens was also focused or defocused.

To better focus light, a diffractive lens may therefore have two or more portions with different refractive indices. Examples of this type are shown in FIGS. 6A and 6B.

Figure 6A:
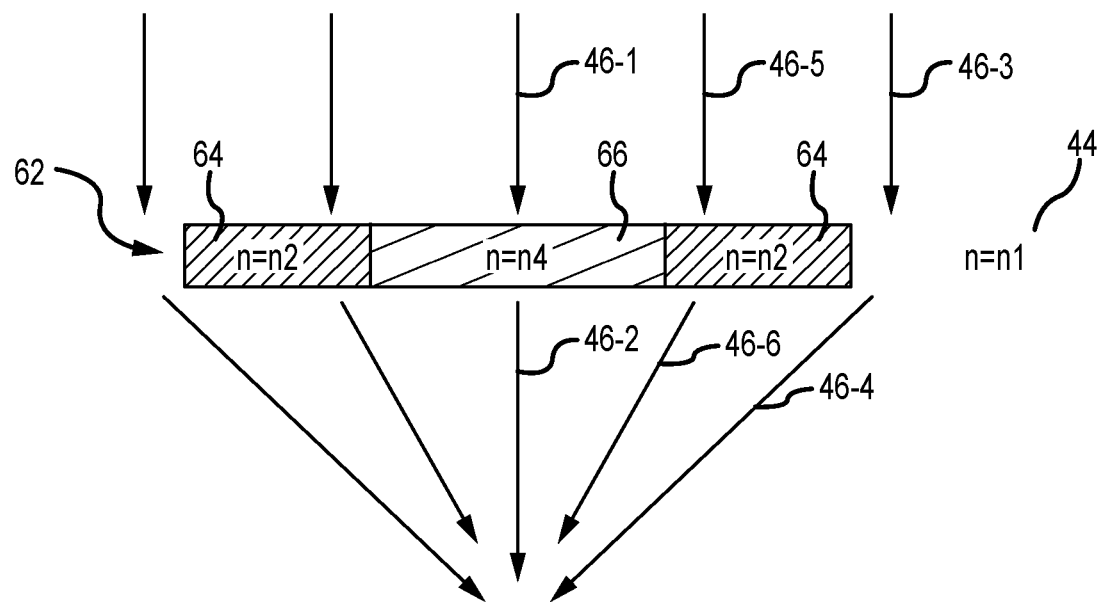
FIG. 6A is a cross-sectional side view of an illustrative multipart focusing diffractive lens with two portions having greater indices of refraction than the surrounding medium in accordance with an embodiment.
Figure 6B:
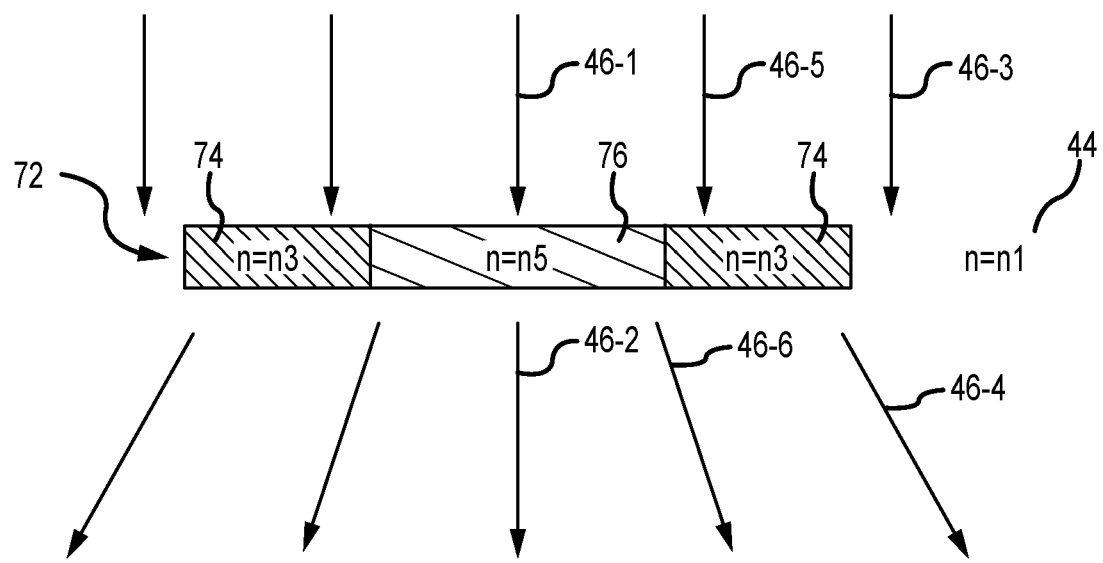
FIG. 6B is a cross-sectional side view of an illustrative multipart defocusing diffractive lens with two portions having lower indices of refraction than the surrounding medium in accordance with an embodiment.

As shown in FIG. 6A, a diffractive lens 62 may be formed in a surrounding medium 44. The surrounding material 44 may be formed from a first material that has a first index of refraction (n1). Diffractive lens 62 may have first portions 64 formed from a second material that has a second index of refraction (n2) and a second portion 66 formed from a third material that has a third index of refraction (n4). In the example of FIG. 6A, the index of refraction of the second portion of the lens (n4) may be greater than the index of refraction of the first portion of the lens (n2) and the index of refraction of the first portion of the lens may be greater than the index of refraction of the surrounding material (i.e., n4>n2>n1). This results in incident light being focused towards a focal point. In this arrangement, diffractive lens 62 acts as a convex lens.

Lens 62 (i.e., both portions 64 and 66 of lens 62) may be transparent to incident light. Therefore, some light may pass through the lens without being focused. For example, incident light 46-1 may pass through the center of portion 66 of diffractive lens 62. The corresponding light 46-2 on the other side of the diffractive lens may travel in the same direction as incident light 46-1. In contrast, incident light at the edge of diffractive lens 62 may be redirected due to diffraction. For example, incident light 46-3 may pass by the edge of diffractive lens 62. The light may be redirected such that the output light 46-4 travels at an angle relative to the incident light 46-3. In other words, the diffractive lens redirects the light at the edge of the lens using diffraction. Additionally, due to the additional refractive index difference between portions 64 and 66 of the diffractive lens, light between the edge and center of the diffractive lens may also be redirected. For example, incident light 46-5 may pass by the interface of portions 64 and 66 of diffractive lens 62. The light may be redirected such that the output light 46-6 travels at an angle relative to the incident light 46-5.

The difference in refractive index between each material may be any desired refractive index difference (e.g., greater than 0.2, greater than 0.3, greater than 0.4, greater than 0.5, greater than 0.8, greater than 1.0, between 0.2 and 0.5, between 0.2 and 0.8, between 0.2 and 1.0, less than 1.0, less than 0.5, less than 0.3, etc.).

The example of the diffractive lens having two portions in FIG. 6A is merely illustrative. If desired, the diffractive lens may have three portions having different refractive indices, four portions having different refractive indices, five portions having different refractive indices, more than five portions having different refractive indices, etc. Regardless of how many portions are present in the diffractive lens, each pair of adjacent portions may have a corresponding refractive index difference. For example, the refractive index of each portion may increase proportionally with the distance of the portion from the edge (meaning that an edge portion such as portion 64 has a lower refractive index than a center portion such as portion 66). Said another way, the refractive index of each portion may decrease proportionally with the distance of the portion from the center.

In the example of FIG. 6A, diffractive lens 62 causes incident light to be focused towards a focal point. However, this example is merely illustrative and other embodiments may be used. FIG. 6B shows a diffractive lens with two or more portions having different refractive indices that defocuses light.

As shown in FIG. 6B, a diffractive lens 72 may be formed in a surrounding medium 44. The surrounding material 44 may be formed from a first material that has a first index of refraction (n1). Diffractive lens 72 may have first portions 74 formed from a second material that has a second index of refraction (n3) and a second portion 76 formed from a third material that has a third index of refraction (n5). In the example of FIG. 6B, the index of refraction of the second portion of the lens (n5) may be less than the index of refraction of the first portion of the lens (n3) and the index of refraction of the first portion of the lens (n3) may be less than the index of refraction of the surrounding material (i.e., n5<n3<n1). This results in incident light being defocused. In this arrangement, diffractive lens 72 acts as a concave lens.

Lens 72 (i.e., both portions 74 and 76 of lens 72) may be transparent to incident light. Therefore, some light may pass through the lens without being focused. For example, incident light 46-1 may pass through the center of portion 76 of diffractive lens 72. The corresponding light 46-2 on the other side of the diffractive lens may travel in the same direction as incident light 46-1. In contrast, incident light at the edge of diffractive lens 72 may be redirected due to diffraction. For example, incident light 46-3 may pass by the edge of diffractive lens 72. The light may be redirected such that the output light 46-4 travels at an angle relative to the incident light 46-3. In other words, the diffractive lens redirects the light at the edge of the lens using diffraction. Additionally, due to the additional refractive index difference between portions 74 and 76 of the diffractive lens, light between the edge and center of the diffractive lens may also be redirected. For example, incident light 46-5 may pass by the interface of portions 74 and 76 of diffractive lens 72. The light may be redirected such that the output light 46-6 travels at an angle relative to the incident light 46-5.

The difference in refractive index between each material may be any desired refractive index difference (e.g., greater than 0.2, greater than 0.3, greater than 0.4, greater than 0.5, greater than 0.8, greater than 1.0, between 0.2 and 0.5, between 0.2 and 0.8, between 0.2 and 1.0, less than 1.0, less than 0.5, less than 0.3, etc.).

The example of the diffractive lens having two portions in FIG. 6B is merely illustrative. If desired, the diffractive lens may have three portions having different refractive indices, four portions having different refractive indices, five portions having different refractive indices, more than five portions having different refractive indices, etc. Each pair of adjacent portions may have a corresponding refractive index difference. For example, the refractive index of each portion may decrease proportionally with the distance of the portion from the edge (meaning that an edge portion such as portion 64 has a higher refractive index than a center portion such as portion 66). Said another way, the refractive index of each portion may increase proportionally with the distance of the portion from the center.

Figure 7A:
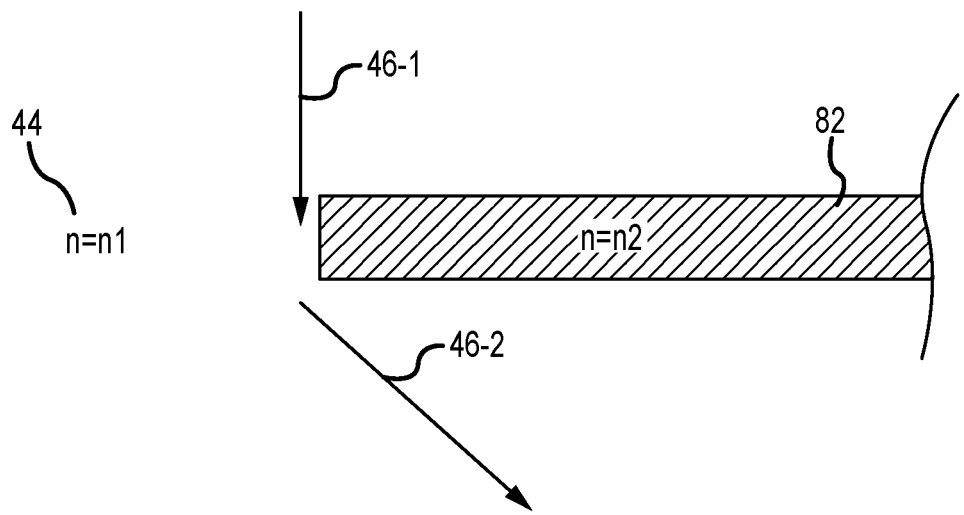
FIG. 7A is a cross-sectional side view of an illustrative diffractive lens element having a single edge that may overlap a phase detection pixel group in accordance with an embodiment.
Figure 7B:
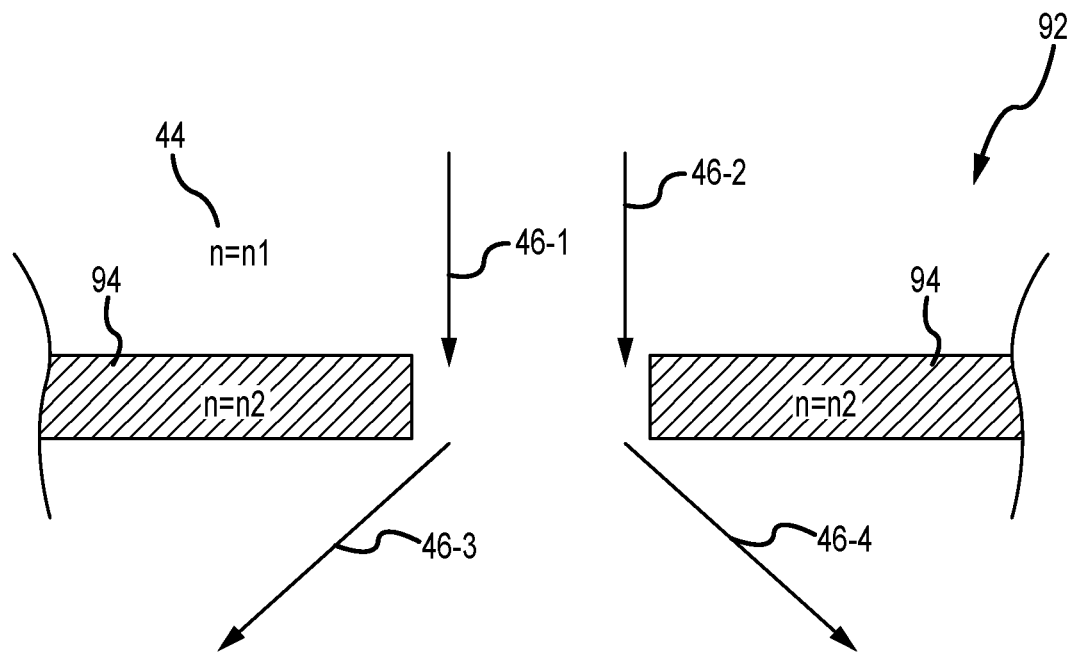
FIG. 7B is a cross-sectional side view of illustrative diffractive lens elements having two edges that may overlap a phase detection pixel group in accordance with an embodiment.

FIGS. 7A and 7B are cross-sectional side views of illustrative diffractive lenses that may be used in image sensors with phase detection pixels. As shown in FIG. 7A, a diffractive lens 82 (sometimes referred to as a diffractive lens element) may be formed in a surrounding medium 44. The surrounding material 44 may be formed from a first material that has a first index of refraction (n1). Diffractive lens 42 may be formed from a second material that has a second index of refraction (n2). In the example of FIG. 7A, the index of refraction of the lens may be greater than the index of refraction of the surrounding material (i.e., n2>n1). In FIG. 7A, only one interface between diffractive lens 82 and surrounding material 44 is present (i.e., only one interface may be present over a phase detection pixel pair). Incident light 46-1 may be redirected at an angle (as shown by light 46-2 at an angle relative to light 46-1).

In FIG. 7B, a diffractive lens 92 may be formed in a surrounding medium 44. The surrounding material 44 may be formed from a first material that has a first index of refraction (n1). Diffractive lens 92 may be formed from a second material that has a second index of refraction (n2). In the example of FIG. 7B, the index of refraction of the lens may be greater than the index of refraction of the surrounding material (i.e., n2>n1). In FIG. 7B, diffractive lens 92 has two diffractive lens portions 94 (sometimes referred to as diffractive lens elements 94). Therefore, there are two interfaces between diffractive lens 92 and surrounding material 44 (i.e., two interfaces may be present over a phase detection pixel pair). Incident light 46-1 and 46-2 may be redirected at an angle (as shown by light 46-3 and 46-4 at angles relative to light 46-1 and 46-2).

In the example above, diffractive lens 92 is referred to as a single (e.g., multipart) diffractive lens that has two diffractive lens portions (elements) 94. This nomenclature is merely illustrative. Alternatively, each diffractive lens portion 94 may be considered a respective diffractive lens (i.e., with two diffractive lenses formed in FIG. 7B).

There are numerous ways to use diffractive lenses to improve phase detection pixel arrangements. In one example, diffractive lenses may be used to increase angular separation of light (e.g., amplify angular response) between photosensitive areas in a phase detection pixel group. In another example, diffractive lenses may be used for offset control when a pixel has an off-axis chief ray angle (CRA).

Figure 8:
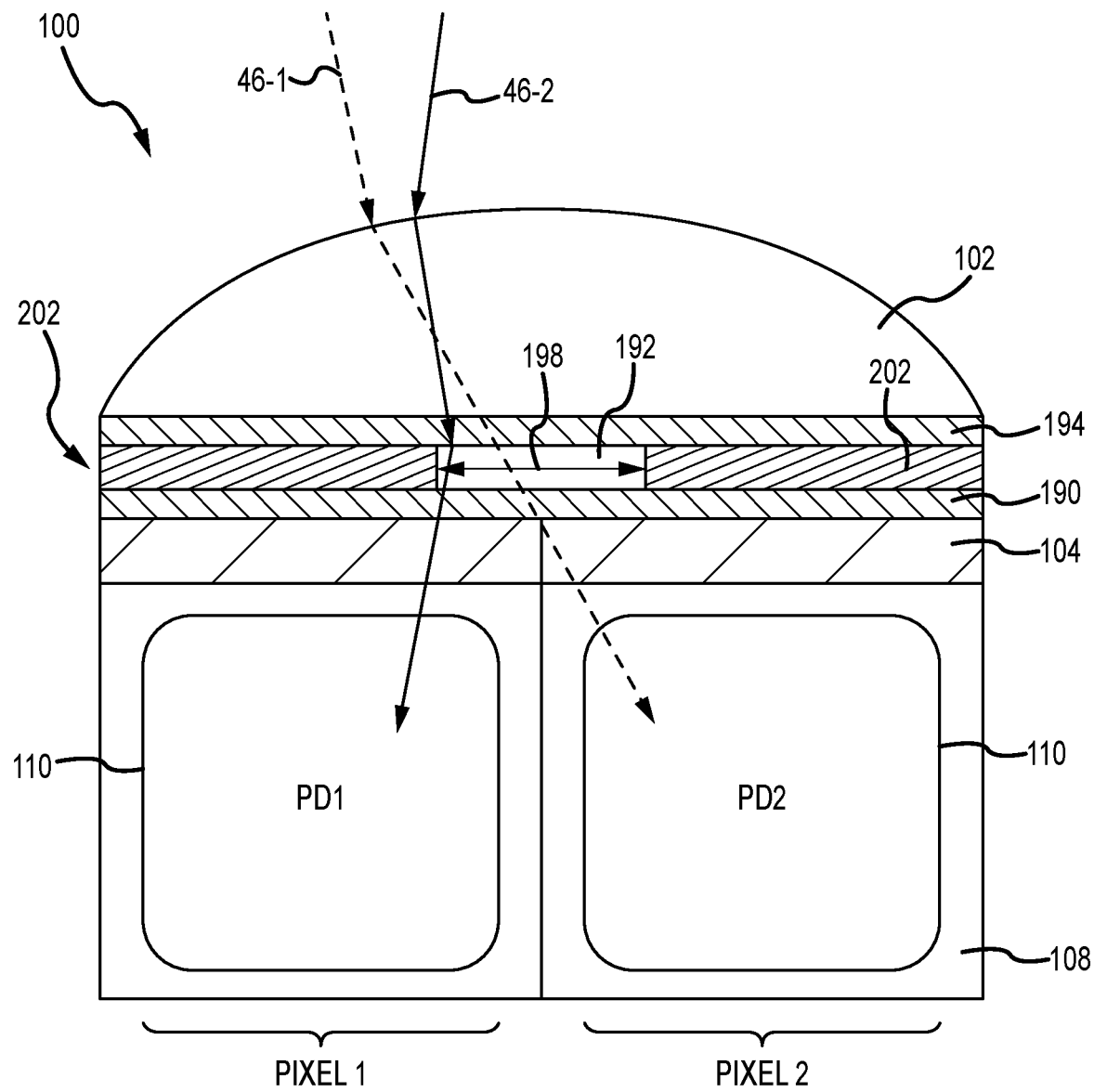
FIG. 8 is a cross-sectional side view of an illustrative phase detection pixel pair that is covered by a diffractive lens to improve angular separation in accordance with an embodiment.

FIG. 8 is a cross-sectional side view of an illustrative phase detection pixel pair with a diffractive lens used to enhance angular response. Image sensor 14 may include first and second pixels such as Pixel 1 and Pixel 2. Pixel 1 and Pixel 2 may include photosensitive regions 110 formed in a substrate such as silicon substrate 108. For example, Pixel 1 may include an associated photosensitive region such as photodiode PD1, and Pixel 2 may include an associated photosensitive region such as photodiode PD2. Isolation regions may optionally be included between PD1 and PD2 and/or around the phase detection pixel pair 100. The isolation regions may include a metal or metal/dielectric grid, deep trench isolation or doped portions of substrate 108. Diffractive lenses 202 may be formed over photodiodes PD1 and PD2 and may be used to direct incident light towards photodiodes PD1 and PD2.

Diffractive lenses 202 may be formed from a material that has a different refractive index than the surrounding material (192). An additional anti-reflective coating (sometimes referred to as a diffractive lens anti-reflective coating) may be formed on one or more surfaces of diffractive lenses 202 if desired.

Color filters such as color filter elements 104 may be interposed between diffractive lenses 202 and substrate 108. Color filter elements 104 may filter incident light by only allowing predetermined wavelengths to pass through color filter elements 104 (e.g., color filter 104 may only be transparent to the certain ranges of wavelengths). Color filter elements 104 may be part of a color filter array formed on the back surface of substrate 108. A respective diffractive lens 202 may cover each color filter element 104 in the color filter array. This example is merely illustrative. If desired, the diffractive lenses may be formed under color filter elements 104 such that the diffractive lenses are interposed between the color filter elements 104 and photosensitive regions 110. Light can enter from the back side of the image pixels through diffractive lenses 202. While in FIG. 8 the image sensor (14) is a back-side illuminated image sensor, the image sensor may instead be a front-side illuminated image sensor if desired. Photodiodes PD1 and PD2 may serve to absorb incident light and produce pixel signals that correspond to the amount of incident light absorbed.

Color filters 104 may include green filters, red filters, blue filters, yellow filters, cyan filters, magenta filters, clear filters, infrared filters, or other types of filters. As an example, a green filter passes green light (e.g., light with wavelengths from 495 nm to 570 nm) and reflects and/or absorbs light out of that range (e.g., the green filter reflects red light and blue light). An example of a color filter array pattern that may be used is the GRBG (green-red-blue-green) Bayer pattern. In this type of configuration, the color filter array is arranged into groups of four color filters. In each group, two of the four color filters are green filters, one of the four color filters is a red filter, and the remaining color filter is a blue filter. If desired, other color filter array patterns may be used. Each phase detection pixel pair 100 may be covered by color filter elements of the same color if desired. For example, PD1 and PD2 in FIG. 8 may be covered by color filter elements of the same color.

A layer 194 (sometimes referred to as a planarization layer, passivation layer, dielectric layer, film, planar film, or planarization film) may be formed over diffractive lenses 202. Planarization layer 194 may be formed across the entire array of imaging pixels in image sensor 14. Layer 194 may have any desired index of refraction (e.g., greater than, less than, or equal to the index of refraction of diffractive lenses 202). A second layer 192 may be formed between diffractive lenses 202 (e.g., layer 192 may be interposed between the side surfaces of adjacent diffractive lenses 202). Layer 192 may have an index of refraction that is less than the index of refraction of diffractive lenses 202. Alternatively, however, layer 192 may have an index of refraction that is greater than the index of refraction of diffractive lenses 202. A third layer 190 may be formed under diffractive lenses 202 between diffractive lenses 202 and color filters 104. Layer 190 may have any desired index of refraction (e.g., greater than, less than, or equal to the index of refraction of diffractive lenses 202). Layers 190, 192, and 194 may be transparent and may be formed from any desired materials. Any of layers 190, 192, and 194 may optionally be omitted. Layers 190, 192, and 194 may be formed from the same materials or different materials. In one possible example, layers 190, 192, and 194 may all be formed from the same material and the diffractive lenses may be embedded within the material. Layers 190, 192, and 194 may sometimes be referred to as planarization layers, dielectric layers, or cladding layers. In some cases, one or more of layers 190, 192, and 194 may be formed from air (i.e., an air gap may present be between diffractive lenses 202). Exemplary materials for layers 190, 192, and 194 include silicon nitride, silicon dioxide, and silicon oxynitride (though other materials may be used if desired).

The difference in refractive index between diffractive lenses 202 and layer 192 may be any desired refractive index difference (e.g., greater than 0.2, greater than 0.3, greater than 0.4, greater than 0.5, greater than 0.8, greater than 1.0, between 0.2 and 0.5, between 0.2 and 0.8, between 0.2 and 1.0, less than 1.0, less than 0.5, less than 0.3, etc.).

Diffractive lenses 202 may be formed from any desired material. It may be desirable for diffractive lenses 202 to be transparent and formed from a material with a higher refractive index than the surrounding materials (e.g., layer 192). Each diffractive lens may be formed from silicon nitride (with a refractive index of approximately 2.0), from silicon dioxide (with a refractive index of approximately 1.45), from silicon oxynitride (with a refractive index of approximately 1.8), or any other desired material. In general, each diffractive lens 202 may have any desired index of refraction (e.g., between 1.8 and 2.0, between 1.6 and 2.2, between 1.5 and 2.5, between 1.5 and 2.0, more than 1.3, more than 1.6, more than 1.8, more than 2.0, less than 2.0, less than 1.8, etc.). Layer 192 may also be transparent and formed from a material with any desired refractive index (e.g., a lower refractive index than diffractive lenses 202). Layer 192 may be formed from a material with a refractive index between 1.3 and 1.5, between 1.2 and 1.8, greater than 1.3, or any other desired refractive index.

In FIG. 8, each diffractive lens has a first side adjacent to the edge of the phase detection pixel pair and a second, opposing side. There is a gap (that may be filled with material from layer 192) between the second sides of each diffractive lens that overlaps the center of the phase detection pixel pair. This arrangement may also be described as a single diffractive lens with an opening that overlaps the center of the phase detection pixel pair (e.g., the border between the first and second pixels in the phase detection pixel pair). This arrangement may also be described as a multipart diffractive lens with a low index of refraction portion (e.g., layer 192) that overlaps the center of the phase detection pixel and that is interposed between two high index of refraction portions (e.g., diffractive lens elements 202). In FIG. 8, the gap between diffractive lenses 202 is centered over the border between Pixel 1 and Pixel 2. This example is merely illustrative. In some cases, the gap between diffractive lenses 202 may be offset (e.g., the center of the gap may be shifted horizontally) relative to the border between Pixel 1 and Pixel 2 to account for chief ray angle. Diffractive lenses may be formed from separate strips (e.g., first and second diffractive lens elements that are not in direct contact) or may instead be a single diffractive lens with an opening (e.g., a ring-shaped diffractive lens or annular diffractive lens).

The refractive indices of the portions of diffractive lenses 202 and the surrounding material (e.g., layer 192) may be selected such that light is directed towards the photodiodes of the pixels based on incident angle. For example, incident light 46-1 may have an incident angle of −10° (e.g., relative to normal axis 116 as discussed in connection with FIG. 2A) and is therefore directed to PD1. Incident light 46-2 may have an incident angle of +10° (e.g., relative to normal axis 116 as discussed in connection with FIG. 2A) and is therefore directed to PD2. The arrangement of diffractive lenses 202 improves the angular separation of incident light. In other words, due to the presence of diffractive lenses 202, a greater percentage of incident light at negative incident angles will be directed to PD1 and a greater percentage of incident light at positive incident angles will be directed to PD2.

As previously discussed, the refractive indices of the diffractive lenses and surrounding materials, as well as the dimensions of the diffractive lenses, may be altered to customize the response to incident light. Additionally, the distance 198 between each diffractive lens element 202 may be altered to change the response of incident light.

In some embodiments, the diffractive lenses over each phase detection pixel pair in the pixel array may be the same. However, in other embodiments different phase detection pixel pairs may have unique diffractive lenses to further customize the response to incident light.

Diffractive lenses 202 in FIG. 8 have planar upper surfaces and planar lower surfaces. In FIG. 8, these diffractive lenses are also covered by a microlens 102 with a curved upper surface. Microlens 102 may focus light using refraction. In some embodiments, microlens 102 may be omitted from FIG. 8. Only the diffractive lenses 202 may be included over the phase detection pixel pair.

In the example of FIG. 8, one multipart diffractive lens is formed over each phase detection pixel pair. This example is merely illustrative. If desired, more than one diffractive lens (e.g., more than one layer of diffractive lenses) may be formed over each phase detection pixel pair. For example, two or more diffractive lens layers may be formed over each phase detection pixel pair.

Figure 9:
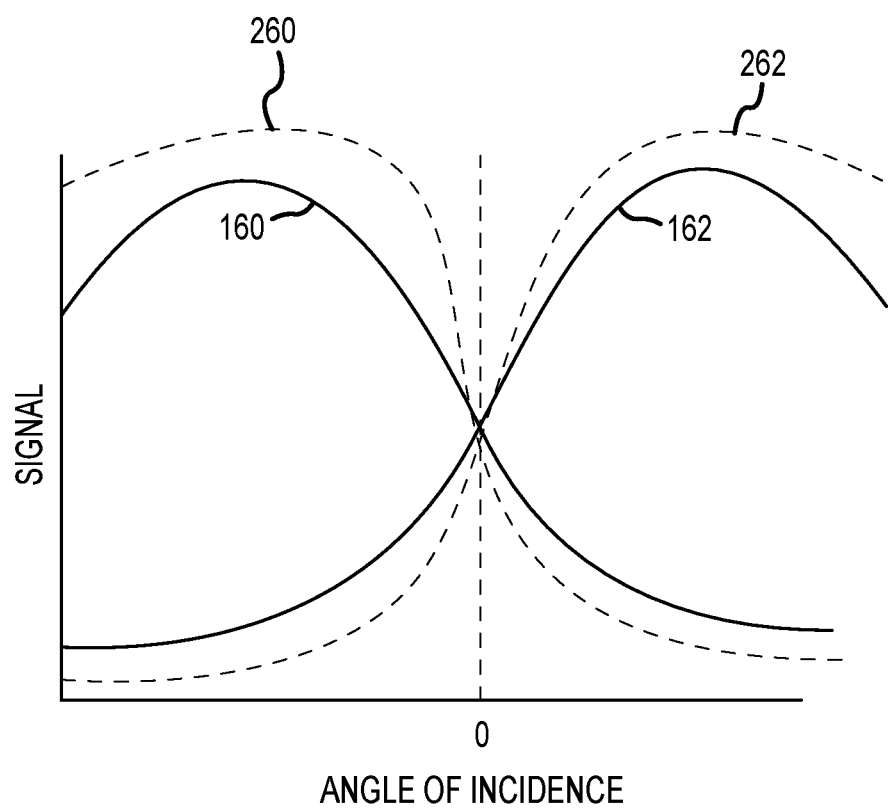
FIG. 9 is a diagram of illustrative signal outputs of phase detection pixels showing how including a diffractive lens over the phase detection pixels may improve angular separation in accordance with an embodiment of the present invention.

The diagram of FIG. 9 shows how the arrangement of FIG. 8 (with diffractive lenses) may improve angular separation compared to the arrangement of FIG. 2A (when diffractive lenses are not included). Line 160 may represent the output image signal for photodiode PD2 of FIG. 2A whereas line 162 may represent the output image signal for photodiode PD1 of FIG. 2A. Line 260 may represent the output image signal for photodiode PD2 of FIG. 8 whereas line 262 may represent the output image signal for photodiode PD1 of FIG. 8. As shown in FIG. 9, adding the diffractive lens to the phase detection pixel pair increases the phase difference between the photodiodes of the phase detection pixel pair (as shown by the greater separation between lines 260 and 262 than between lines 160 and 162).

Figure 10:
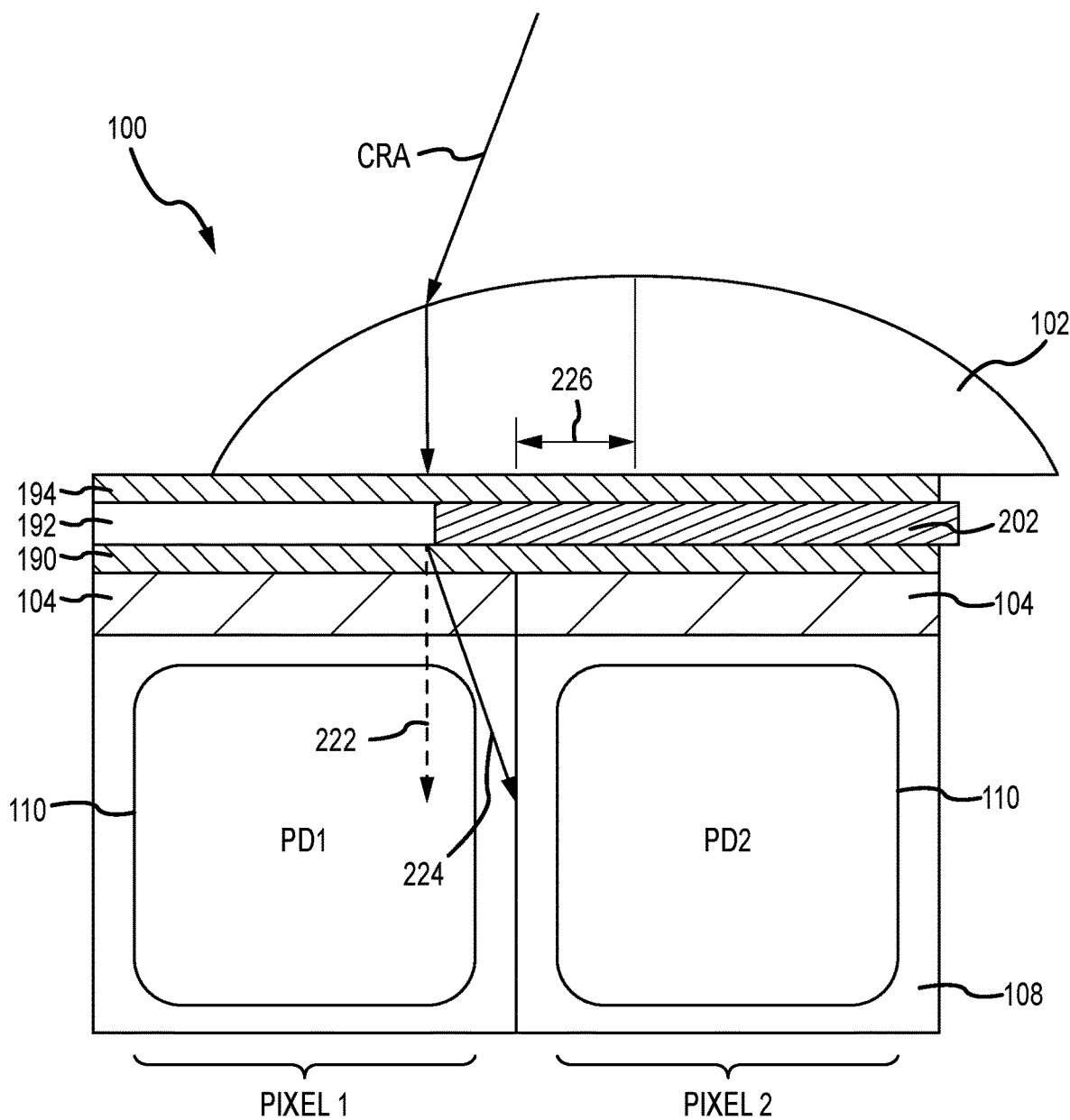
FIG. 10 is a cross-sectional side view of an illustrative phase detection pixel pair that is covered by a diffractive lens to account for chief ray angle in accordance with an embodiment.

FIG. 10 is a cross-sectional side view of an illustrative phase detection pixel pair with a diffractive lens for offset control. Pixels in an image sensor may account for the chief ray angle associated with the pixel's location. For example, a pixel in the center of the image sensor may have a chief ray angle of 0° (e.g., on-axis). As the location of the pixel approaches the edge of the image sensor (and gets further from the center of the image sensor) the chief ray angle may increase to angles greater than 0° (e.g., more off-axis). To account for the difference in chief ray angle (CRA), the microlens of a pixel may be shifted relative to the underlying photosensitive area (e.g., the microlens may be shifted towards the center of the image sensor). A diffractive lens may also be incorporated into pixels to help account for the CRA.

As shown in FIG. 10, phase detection pixel pair 100 may include first and second pixels such as Pixel 1 and Pixel 2. Pixel 1 and Pixel 2 may include photosensitive regions 110 formed in a substrate such as silicon substrate 108. For example, Pixel 1 may include an associated photosensitive region such as photodiode PD1, and Pixel 2 may include an associated photosensitive region such as photodiode PD2. Isolation regions may optionally be included between PD1 and PD2 and/or around the phase detection pixel pair 100. The isolation regions may include a metal or metal/dielectric grid, deep trench isolation or doped portions of substrate 108. A diffractive lens 202 may be formed over the phase detection pixel pair and may be used to correct for offset in the chief ray angle.

Diffractive lenses 202 may be formed from a material that has a different refractive index than the surrounding material (192). An additional anti-reflective coating (sometimes referred to as a diffractive lens anti-reflective coating) may be formed on one or more surfaces of diffractive lenses 202 if desired.

Color filters such as color filter elements 104 may be interposed between diffractive lens 202 and substrate 108. Color filter elements 104 may filter incident light by only allowing predetermined wavelengths to pass through color filter elements 104 (e.g., color filter 104 may only be transparent to the certain ranges of wavelengths). This example is merely illustrative. If desired, the diffractive lenses may be formed under color filter elements 104 such that the diffractive lenses are interposed between the color filter elements 104 and photosensitive regions 110. Light can enter from the back side of the image pixels through diffractive lenses 202. While in FIG. 10 the image sensor (14) is a back-side illuminated image sensor, the image sensor may instead be a front-side illuminated image sensor if desired. Photodiodes PD1 and PD2 may serve to absorb incident light and produce pixel signals that correspond to the amount of incident light absorbed.

A layer 194 (sometimes referred to as a planarization layer, passivation layer, dielectric layer, film, planar film, or planarization film) may be formed over diffractive lens 202. Planarization layer 194 may be formed across the entire array of imaging pixels in image sensor 14. Layer 194 may have any desired index of refraction (e.g., greater than, less than, or equal to the index of refraction of diffractive lenses 202). A second layer 192 may be formed adjacent to diffractive lens 202 (e.g., layer 192 may be adjacent to the side surfaces of diffractive lens 202). Layer 192 may have an index of refraction that is less than the index of refraction of diffractive lens 202. Alternatively, however, layer 192 may have an index of refraction that is greater than the index of refraction of diffractive lens 202. A third layer 190 may be formed under diffractive lens 202 between diffractive lens 202 and color filters 104. Layer 190 may have any desired index of refraction (e.g., greater than, less than, or equal to the index of diffractive lenses 202). Layers 190, 192, and 194 may be transparent and may be formed from any desired materials. Any of layers 190, 192, and 194 may be omitted if desired. Layers 190, 192, and 194 may be formed from the same materials or different materials. In one possible example, layers 190, 192, and 194 may all be formed from the same material and the diffractive lenses may be embedded within the material. Layers 190, 192, and 194 may sometimes be referred to as planarization layers, dielectric layers, or cladding layers. In some cases, one or more of layers 190, 192, and 194 may be formed from air (i.e., an air gap may present adjacent to diffractive lens 202). Exemplary materials for layers 190, 192, and 194 include silicon nitride, silicon dioxide, and silicon oxynitride (though other materials may be used if desired).

The difference in refractive index between diffractive lens 202 and layer 192 may be any desired refractive index difference (e.g., greater than 0.2, greater than 0.3, greater than 0.4, greater than 0.5, greater than 0.8, greater than 1.0, between 0.2 and 0.5, between 0.2 and 0.8, between 0.2 and 1.0, less than 1.0, less than 0.5, less than 0.3, etc.).

Diffractive lens 202 may be formed from any desired material. It may be desirable for diffractive lens 202 to be transparent and formed from a material with a higher refractive index than the surrounding materials (e.g., layer 192). Each diffractive lens may be formed from silicon nitride (with a refractive index of approximately 2.0), from silicon dioxide (with a refractive index of approximately 1.45), from silicon oxynitride (with a refractive index of approximately 1.8), or any other desired material. In general, each diffractive lens 202 may have any desired index of refraction (e.g., between 1.8 and 2.0, between 1.6 and 2.2, between 1.5 and 2.5, between 1.5 and 2.0, more than 1.3, more than 1.6, more than 1.8, more than 2.0, less than 2.0, less than 1.8, etc.). Layer 192 may also be transparent and formed from a material with any desired refractive index (e.g., a lower refractive index than diffractive lens 202). Layer 192 may be formed from a material with a refractive index between 1.3 and 1.5, between 1.2 and 1.8, greater than 1.3, or any other desired refractive index.

In FIG. 10, the diffractive lens has a first side adjacent to the right-edge of the phase detection pixel pair and a second, opposing side. The second side extends over PD1. In other words, the diffractive lens overlaps all of PD2 and partially overlaps PD1. The diffractive lens overlaps more of PD2 than PD1. There is a gap between the left-edge of the phase detection pixel pair and the second side of the diffractive lens. This example is merely illustrative. If desired, the diffractive lens may only partially overlap PD2 and not overlap PD1, may only partially overlap PD1 and not overlap PD2, may partially overlap both PD1 and PD2, may overlap all of PD1 and partially overlap PD2, etc. In general, the position of diffractive lens (and the amount of overlap with underlying photodiodes) may be selected to correct for the chief ray angle associated with the pixel pair.

The refractive indices of the diffractive lens 202 and the surrounding material (e.g., layer 192) may be selected such that light of the chief ray angle (CRA) is directed towards the border between photodiodes PD1 and PD2 (e.g., a portion of substrate 108 between PD1 and PD2). For phase detection pixel pairs, it is desirable for the chief ray angle to result in an equal amount of light reaching PD1 and PD2. Without the diffractive lens of FIG. 10, the off-axis CRA may instead result in more light reaching one of the two photodiodes than the other photodiode. Path 222 shows an illustrative path of off-axis light if diffractive lens 202 was not present. As shown, without diffractive lens 202, the light ends up in PD1 (meaning that even when focused, more light is received by PD1 than PD2). The diffractive lens corrects for the shift in angular response caused by the CRA. Path 224 shows the path of the off-axis light with the presence of diffractive lens 202. As shown, with diffractive lens 202 present, the light is redirected to the border between PD1 and PD2 (ensuring that PD1 and PD2 receive equal amounts of light when focused). The diffractive lens may optionally be used in combination with a shifted microlens, as shown in FIG. 10. The center of microlens 102 may be shifted from the border between Pixels 1 and 2 by a distance 226 (sometimes referred as shift 226 or offset 226). This offset may be any desired distance and may vary across an image sensor array. In some cases, no offset may be present (e.g., distance 226 is equal to 0).

As previously discussed, the refractive indices of the diffractive lens and surrounding materials, as well as the dimensions of the diffractive lenses, may be altered to customize the response to incident light. The amount of overlap of the diffractive lens and the photodiodes may be altered as desired to customize the response to incident light. The amount of overlap of the diffractive lens to the underlying photodiodes may vary across the image sensor.

In some embodiments, the diffractive lens over each phase detection pixel pair in the pixel array may be the same. However, in other embodiments different phase detection pixel pairs may have unique diffractive lenses to further customize the response to incident light. For example, the amount of overlap between each diffractive lens and the underlying photodiodes may be based on the location of the phase detection pixel pair within the image sensor (to control offset).

In the example of FIG. 10, one diffractive lens is formed over each phase detection pixel pair for offset control. This example is merely illustrative. If desired, more than one diffractive lens (e.g., more than one layer of diffractive lenses) may be formed over each phase detection pixel pair for offset control. For example, two or more diffractive lens layers may be formed over each phase detection pixel pair.

Figure 11:
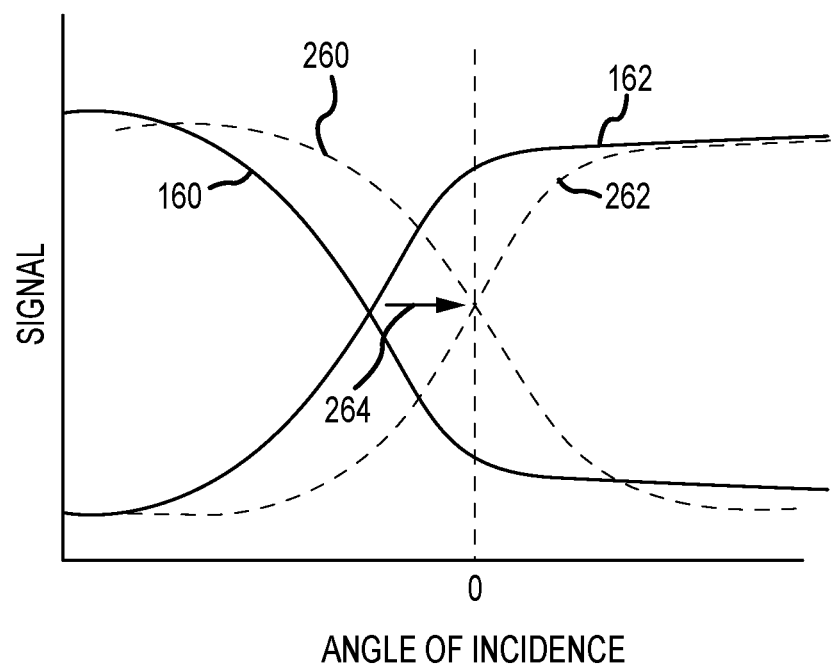
FIG. 11 is a diagram of illustrative signal outputs of phase detection pixels showing how including a diffractive lens over the phase detection pixels may offset the angular response to account for chief ray angle in accordance with an embodiment of the present invention.

The diagram of FIG. 10 shows how the arrangement of FIG. 10 (with diffractive lenses) may ensure symmetrical angular separation for an off-axis CRA compared to the arrangement of FIG. 2A (when diffractive lenses are not included). Line 160 may represent the output image signal for an off-axis CRA for photodiode PD2 of FIG. 2A and line 162 may represent the output image signal for an off-axis CRA for photodiode PD1 of FIG. 2A. Line 260 may represent the output image signal for an off-axis CRA for photodiode PD2 of FIG. 10 whereas line 262 may represent the output image signal for an off-axis CRA for photodiode PD1 of FIG. 10. As shown in FIG. 11, without the diffractive lens, the two signals (160 and 162) are equal at an angle other than 0°. By including the diffractive lens of FIG. 10, the two signals (260 and 262) are shifted in direction 264 and are equal at a 0° angle as desired. The diffractive lens therefore is used for an offset of the phase detection response.

The diffractive lenses for offset control may be particularly useful for image sensors that include both phase detection pixels (e.g., pixels with asymmetric angular responses to incident light) and image sensor pixels (e.g., pixels with symmetric angular responses to incident light). Instead of two (or more) phase detection pixels covered by a single microlens, each respective image sensor pixel may be covered by a corresponding microlens. The optimal microlens shift for image sensor pixels and phase detection pixels to account for CRA may be different. However, manufacturing requirements may require a similar microlens shift to be used for adjacent image sensor pixels and phase detection pixels. The diffractive lens (e.g., of FIG. 10) may therefore be used to help further account for CRA.

In various embodiments, an image sensor may include a first photosensitive area, a second photosensitive area, a microlens that covers the first and second photosensitive areas, and a diffractive lens that is interposed between the microlens and the first and second photosensitive areas. The first and second photosensitive areas may have asymmetric angular responses to incident light. The first and second photosensitive areas may form a phase detection pixel pair. The first and second photosensitive areas may be part of a phase detection pixel group.

The diffractive lens may comprise a multipart diffractive lens having a first portion over the first photosensitive area and a second portion over the second photosensitive area. The first and second portions of the multipart diffractive lens may be separated by a gap. The gap may overlap a border between the first and second photosensitive areas. The first and second portions of the multipart diffractive lens may have a first refractive index and a layer having a second refractive index that is lower than the first refractive index may be interposed between the first and second portions. The diffractive lens may overlap the entire first photosensitive area and only a portion of the second photosensitive area. The position of the diffractive lens relative to the first and second photosensitive areas may vary across the image sensor. The first and second photosensitive areas may be at a location in the image sensor that is associated with a non-zero chief ray angle.

In various embodiments, an image sensor may include a first phase detection pixel, a second phase detection pixel, and at least one diffractive lens element formed over the first and second phase detection pixels. The at least one diffractive lens element may include a first diffractive lens element formed over the first phase detection pixel and a second diffractive lens element formed over the second phase detection pixel.

The first and second diffractive lens elements may be separated by a layer of material that is interposed between the first and second diffractive lens elements and the layer of material may have a lower index of refraction than the first and second diffractive lens elements. The layer of material may overlap a border that is interposed between the first and second phase detection pixels. The at least one diffractive lens element may comprise a single diffractive lens element that covers more of the first phase detection pixel than the second phase detection pixel. No microlens with a curved surface may be formed over first and second phase detection pixels.

In various embodiments, an image sensor may include a substrate, a first photodiode in the substrate, a second photodiode in the substrate, wherein the first and second photodiodes have opposite asymmetric angular responses to incident light, a microlens that covers the first and second photodiode, and a diffractive lens formed between the first and second photodiodes and the microlens. The diffractive lens may have an opening that overlaps a portion of the substrate that is interposed between the first and second photodiodes.

A layer of material with a lower index of refraction than the diffractive lens may fill the opening. The diffractive lens may be a ring-shaped diffractive lens. The diffractive lens may have first and second portions that are completely separated from each other by the opening.

The foregoing is merely illustrative of the principles of this invention and various modifications can be made by those skilled in the art. The foregoing embodiments may be implemented individually or in any combination.

What is claimed is:

1. An image sensor comprising:
   a first photosensitive area;
   a second photosensitive area;
   a microlens that covers the first and second photosensitive areas; and
   a diffractive lens that is interposed between the microlens and the first and second photosensitive areas, wherein the diffractive lens overlaps the entire first photosensitive area and only a portion of the second photosensitive area.

2. The image sensor defined in claim 1, wherein the first and second photosensitive areas have asymmetric angular responses to incident light.

3. The image sensor defined in claim 1, wherein the first and second photosensitive areas form a phase detection pixel pair.

4. The image sensor defined in claim 1, wherein the first and second photosensitive areas are part of a phase detection pixel group.

5. The image sensor defined in claim 1, wherein the first and second photosensitive areas are at a location in the image sensor that is associated with a non-zero chief ray angle.

6. An image sensor comprising:
   a first phase detection pixel;
   a second phase detection pixel; and
   at least one diffractive lens element formed over the first and second phase detection pixels, wherein the at least one diffractive lens element comprises a single diffractive lens element that covers more of the first phase detection pixel than the second phase detection pixel.

7. The image sensor defined in claim 6, wherein no microlens with a curved surface is formed over first and second phase detection pixels.

8. The image sensor defined in claim 6, wherein the first and second phase detection pixels are at a location in the image sensor that is associated with a non-zero chief ray angle.

9. The image sensor defined in claim 6, wherein the diffractive lens overlaps the entire first phase detection pixel and only a portion of the second phase detection pixel.

* * * * *